US006900521B2

(12) United States Patent
Forbes et al.

(10) Patent No.: US 6,900,521 B2
(45) Date of Patent: May 31, 2005

(54) VERTICAL TRANSISTORS AND OUTPUT PREDICTION LOGIC CIRCUITS CONTAINING SAME

(75) Inventors: Leonard Forbes, Corvallis, OR (US); Kie Y. Ahn, Chappaqua, NY (US)

(73) Assignee: Micron Technology, Inc., Boise, ID (US)

( * ) Notice: Subject to any disclaimer, the term of this patent is extended or adjusted under 35 U.S.C. 154(b) by 11 days.

(21) Appl. No.: 10/164,611

(22) Filed: Jun. 10, 2002

(65) Prior Publication Data

US 2003/0227072 A1 Dec. 11, 2003

(51) Int. Cl.[7] .............................................. H01L 31/117
(52) U.S. Cl. ...................... 257/616; 257/191; 257/335
(58) Field of Search ................................. 257/135, 191, 257/219–221, 263, 302, 328–329, 335, 616, 19; 438/933

(56) References Cited

U.S. PATENT DOCUMENTS

| | | | | |
|---|---|---|---|---|
| 4,569,032 A | * | 2/1986 | Lee ............................. 708/710 |
| 5,451,800 A | * | 9/1995 | Mohammad ................. 257/191 |
| 5,714,777 A | * | 2/1998 | Ismail et al. ................. 257/263 |
| 5,821,577 A | * | 10/1998 | Crabbe' et al. .............. 257/288 |
| 6,191,432 B1 | * | 2/2001 | Sugiyama et al. ............. 257/19 |
| 6,313,487 B1 | * | 11/2001 | Kencke et al. ............... 257/192 |
| 6,744,083 B2 | * | 6/2004 | Chen et al. .................. 257/219 |
| 2002/0125497 A1 | * | 9/2002 | Fitzgerald .................... 257/191 |
| 2002/0168864 A1 | * | 11/2002 | Cheng et al. ................ 438/725 |
| 2002/0179946 A1 | * | 12/2002 | Hara et al. ................... 257/288 |
| 2003/0057439 A1 | * | 3/2003 | Fitzgerald .................... 257/192 |
| 2003/0068883 A1 | * | 4/2003 | Ajmera et al. .............. 438/664 |
| 2003/0201458 A1 | * | 10/2003 | Clark et al. .................. 257/192 |

* cited by examiner

Primary Examiner—Tom Thomas
Assistant Examiner—Jose R. Diaz
(74) Attorney, Agent, or Firm—Dickstein Shapiro Morin & Oshinsky LLP

(57) ABSTRACT

Very fast integrated OPL circuits, such as pseudo-NMOS OPL and dynamic OPL, comprising CMOS gate arrays having ultra-thin vertical NMOS transistors are disclosed. The ultra-thin vertical NMOS transistors of the CMOS gate arrays are formed with relaxed silicon germanium (SiGe) body regions with graded germanium content and strained silicon channels.

19 Claims, 8 Drawing Sheets

VERTICAL TRANSISTORS AND OUTPUT PREDICTION LOGIC CIRCUITS CONTAINING SAME

FIELD OF THE INVENTION

The present invention relates generally to the field of integrated circuits, and more specifically, to novel output prediction logic circuits and methods of formation.

BACKGROUND OF THE INVENTION

Complementary Metal Oxide Semiconductor (CMOS) technology is well-known in the fabrication of integrated circuits. CMOS technology is employed not only for analog integrated circuits, but also for digital integrated circuits to which they confer low power dissipation, high density of integration and low cost of fabrication.

FIG. 1 illustrates a prior art conventional static CMOS NAND gate circuit 10. One of the drawbacks associated with the static CMOS NAND gate circuit 10 of FIG. 1 is that each input 12, 14 must drive two gates, the gate of an NMOS transistor and the gate of a PMOS transistor. Input 12 drives gates 16 and 18, while input 14 drives gates 20 and 22. As a result, large CMOS circuitry area and large number of metal wiring levels must be utilized to allow interconnections. Another drawback is that the hole mobility in a PMOS transistor is about three times lower than the electron mobility in an NMOS transistor of comparable size. Accordingly, switching transients are very asymmetrical. To compensate the asymmetry of the switching transients, the PMOS transistors are often fabricated with a large width or size to provide symmetrical switching. Nevertheless, the increase in the size of the PMOS transistors increases the stray capacitive loads, which in turn requires an even larger area for the circuits and a very inefficient area utilization.

Output prediction logic (OPL) is a technique that applies to a variety of inverting logic families to increase speed considerably. OPL relies on the alternating nature of logical output values for inverting gates on a critical path. In other words, for any critical path, the logical values of the gates along that particular path will be alternating ones (1) and zeros (0). Since all gates are inverting, the OPL predictions will be correct exactly one-half the time. By correctly predicting exactly one half of the gate output, OPL obtains considerable speedups, of at least two times, over the underlying logic families, which can be, for example, static CMOS, pseudo-NMOS or dynamic logic.

Recently, in McMurchie L.; Kio, S.; Yee, G.; Thorp, T.; Sechen, C., Output prediction logic: a High-Performance CMOS Design Technique, Proc. International Conference on Computer Design, 2000, pp. 247–254, 2000 (the disclosure of which is incorporated herein), McMurchie et al. have described a very fast logic circuit that comprises integrated CMOS technology. One of the features of the integrated logic circuit family described by McMurchie et al. is that all of the outputs are precharged high. Only if necessary and if determined by the logic function, high performance NMOS transistors are then used to discharge the output node low.

Subsets of integrated fast logic circuit families, such as pseudo-NMOS, have been analyzed and described as being particularly suited to array-type applications. For example, in *Grounded load complementary FET circuits; SCEPTRE analysis,* IEEE J. Solid-State Circuits, Vol. SC-8, No. 4, pp. 282–284 (1973), Sakamoto and Forbes have described a pseudo-NMOS implementation of CMOS circuits. In OPL, the lower performance PMOS devices in CMOS technology are used only for precharge functions which did not have critical speed requirements. Improvements of the pseudo-NMOS circuits analyzed by Sakamoto et al. are obtained as a result of a unique clocking scheme described here in employing OPL.

Although advances in the integration of CMOS logic families are becoming increasingly notable, a major disadvantage remains the slow speed of the integrated CMOS logic circuits. The conventional integrated CMOS logic circuit is considerably slower than the OPL circuit mainly because of the PMOS devices that charge an output node high if the logic input is appropriate. Thus, the use of PMOS devices for logical switching transitions generally results in a slower speed for the integrated CMOS logic circuit.

In addition to the drawbacks posed by the integration of CMOS logic families described above, the continuous scaling of MOSFET technology to reduce channel lengths to sub-micron dimensions causes significant problems in the conventional transistor structures. Because junctions depths should be much less than the channel length, junction depths should be of a few hundred Angstroms for channel lengths of 1000 Angstroms. Such shallow junctions are difficult to form by conventional implantation and diffusion techniques. Extremely high levels of channel doping are required to suppress short-channel effects such as drain induced barrier lowering, threshold voltage roll off, and sub-threshold conduction. Sub-threshold conduction is particularly problematic in dynamic circuits technology because it reduces the charge storage retention time on capacitor nodes. These extremely high doping levels result in increased leakage and reduced carrier mobility. Therefore, the improved performance achieved by making the channel shorter is negated by low carrier mobility.

Accordingly, there is a need in the art for a logic circuit with CMOS gate arrays with very high performance NMOS transistors and faster switching speeds. There is also a need for CMOS gate arrays with transistors where the surface space charge region scales down as other transistor dimensions scale down. A method for fabricating very high performance transistors and a gate array including such high performance transistors is also needed. A method for fabricating a very fast CMOS logic circuit, as well as a method of increasing the noise margin while maintaining the performance gain of such integrated CMOS logic circuits, are also needed.

BRIEF SUMMARY OF THE INVENTION

In one embodiment, the present invention provides very fast integrated CMOS logic circuits comprising CMOS gate arrays having ultra-thin vertical NMOS transistors with relaxed silicon germanium (SiGe) body regions and strained silicon channels. The ultra-thin vertical NMOS transistors comprise a relaxed silicon germanium (SiGe) body region with a graded germanium content and a strained silicon channel in contact with the relaxed silicon germanium (SiGe) body region.

According to another embodiment of the present invention, ultra-thin body vertical NMOS transistors are fabricated by epitaxially growing a relaxed silicon germanium (SiGe) body region by ultra-high vacuum chemical vapor deposition (UHVCVD) and subsequently forming a strained silicon channel in contact with the relaxed silicon germanium (SiGe) body region.

According to yet another embodiment of the invention, CMOS gate arrays with ultra-thin vertical NMOS transistors with relaxed silicon germanium (SiGe) body regions and strained silicon channels are employed to form a pseudo-NMOS OPL circuit. The pseudo-NMOS logic circuit includes a number of logic inputs, a clock input and an output. The number of logic inputs are coupled to a number of gates of the vertical ultra-thin NMOS transistors having relaxed silicon germanium (SiGe) body regions and strained silicon channels. The clock input is coupled to a gate of a vertical ultra-thin NMOS transistor with a relaxed silicon germanium (SiGe) body region and a strained silicon channel for precharging the output. The output is charged high by a PMOS device with a gate at ground potential.

In another embodiment of the invention, CMOS gate arrays comprising ultra-thin vertical NMOS transistors with relaxed silicon germanium (SiGe) body regions and strained silicon channels are employed to form a dynamic OPL circuit. The dynamic logic circuit includes a number of logic inputs, a clock input and an output. The number of logic inputs are coupled to a number of gates of vertical ultra-thin NMOS transistors with relaxed silicon germanium (SiGe) body regions and strained silicon channels. The clock input is coupled to a gate of a vertical ultra-thin NMOS transistor with a relaxed silicon germanium (SiGe) body region and a strained silicon channel for precharging the output. The output is charged high by a PMOS transistor.

These and other embodiments, features and advantages of the present invention will become more fully apparent from the following detailed description of the exemplary embodiments of the invention which are provided in connection with the accompanying drawings.

DETAILED DESCRIPTION OF THE INVENTION

Figure 1:
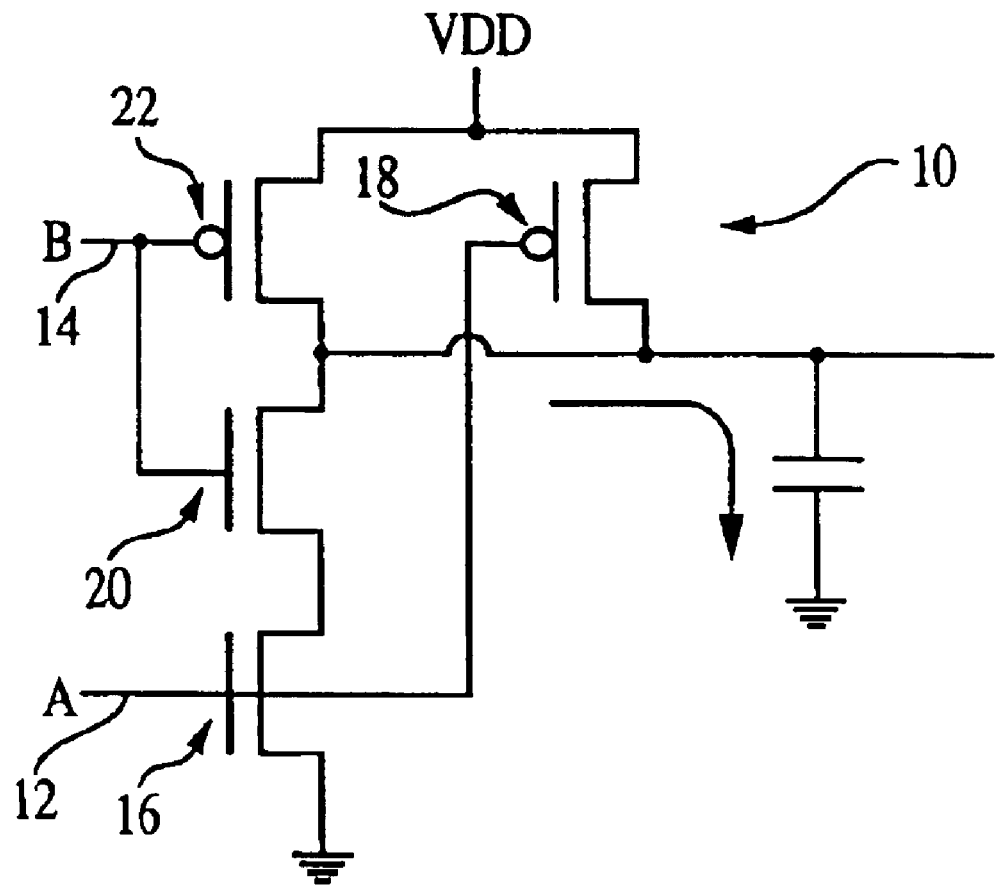
FIG. 1 is a schematic diagram illustrating a conventional static CMOS logic circuit.

In the following detailed description, reference is made to various specific embodiments in which the invention may be practiced. These embodiments are described with sufficient detail to enable those skilled in the art to practice the invention, and it is to be understood that other embodiments may be employed, and that structural, logical, and electrical changes may be made.

The term "substrate" used in the following description may include any semiconductor-based structure that has a silicon surface. Structure must be understood to include silicon, silicon-on insulator (SOI), silicon-on sapphire (SOS), doped and undoped semiconductors, epitaxial layers of silicon supported by a base semiconductor foundation, and other semiconductor structures. The semiconductor also need not be silicon-based. The semiconductor could be silicon-germanium, germanium, or gallium arsenide. When reference is made to a substrate in the following description, previous process steps may have been utilized to form regions or junctions in or on the base semiconductor or foundation.

The present invention provides a method for the fabrication of integrated CMOS output prediction logic (OPL) circuits with very fast speed and decreased noise sensitivity. The very fast output prediction logic (OPL) circuits comprise CMOS gate arrays with ultra-thin vertical NMOS transistors having relaxed silicon germanium (SiGe) body regions and strained silicon channels. Each of the ultra-thin vertical NMOS transistors comprises a relaxed silicon germanium (SiGe) body region having a graded germanium (Ge) content and a strained silicon channel in contact with the relaxed silicon germanium (SiGe) body region. The CMOS gate arrays with the ultra-thin vertical NMOS transistors having relaxed silicon germanium (SiGe) body regions and strained silicon channels of the present invention may be employed in the fabrication of output prediction logic (OPL) circuits, for example, pseudo-NMOS OPL circuits and dynamic OPL circuits.

Referring now to the drawings, where like elements are designated by like reference numerals, FIGS. 2–10 illustrate the fabrication of ultra-thin vertical NMOS transistors 300a, 300b (FIG. 10) with relaxed silicon germanium (SiGe) body regions having a graded germanium content and with strained silicon channels. The fabrication of the ultra-thin vertical NMOS transistors 300a, 300b of FIG. 10 requires steps which are similar in part with those employed in the fabrication of vertical PMOS and NMOS transistors, described before in the literature and which will not be described in detail below. For example, U.S. Pat. No. 6,072,209 to Noble et al. and U.S. Pat. No. 6,150,687 to Noble et al., the disclosures of which are incorporated by reference herein, have detail descriptions for the fabrication of vertical gates for vertical PMOS and NMOS transistors and outline steps which are similar in part to those of the present application, to the extent that the cited references refer to vertical PMOS and NMOS transistors having body regions formed of silicon and not to NMOS transistors having body regions of silicon germanium with a graded germanium content. For a better understanding of the present invention, however, the processing steps for the fabrication of the ultra-thin vertical NMOS transistors with relaxed silicon germanium (SiGe) body region and strained silicon channels will be briefly described below.

Figure 2:
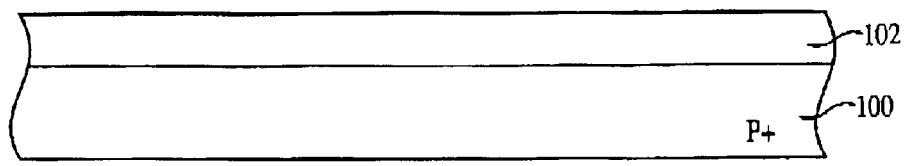
FIG. 2 illustrates a cross-sectional view of a semiconductor substrate on which ultra-thin vertical transistors with a strained silicon channel are fabricated according to an embodiment of the present invention.

FIG. 2 illustrates a semiconductor substrate 100 and a first source/drain layer 102 formed over the semiconductor substrate 100. In the embodiments of the present invention described below, the semiconductor substrate 100 may be any of the following three different types of substrates:

(i) lightly doped p-type;
(ii) silicon on insulator substrates, such as SIMOX, for example; and
(iii) islands of silicon on insulator formed by techniques such as those described in U.S. Pat. No. 5,691,230 to Forbes, the disclosure of which is incorporated by reference herein.

As known in the art, SIMOX (Separation by IMplanted OXygen) involves implanting a high dose of oxygen ions at a sufficiently deep level within a silicon substrate. A subsequent anneal step forms a buried oxide layer into the substrate. After the anneal step, an additional layer of epitaxial silicon is usually deposited to obtain a sufficiently thick silicon layer on which to form the desired device.

As also known in the art, a substrate of islands of silicon on insulator can be formed, for example, by directionally etching a silicon substrate to form a plurality of trenches between protruding silicon rows; forming a nitride cap on the silicon rows, extending partway down the sides of the trenches; isotropically etching the trenches to partially undercut the silicon rows; and oxidizing the substrate to fully undercut the silicon rows.

For simplicity and for a better understanding of the present invention, reference to the semiconductor substrate 100 will be made in this application as to p-type silicon substrate 100. Similarly, although the first source/drain layer 102 (FIG. 2) may be either an n+ silicon source/drain layer 102 (for NMOS transistors) or a p+ silicon source/drain layer 102 (for PMOS transistors), for the purposes of the present invention, the first source/drain layer 102 of FIG. 2 would be considered an n+ silicon source/drain layer 102. The n+ silicon source/drain layer 102 may be formed by ion implantation, epitaxial growth, or a combination of these techniques. Vertical NMOS transistors with strained silicon channels and relaxed silicon germanium (SiGe) body regions will be formed on the n+ silicon source/drain layer 102 in accordance with embodiments of the present invention and as illustrated in more detail below.

Figure 3:
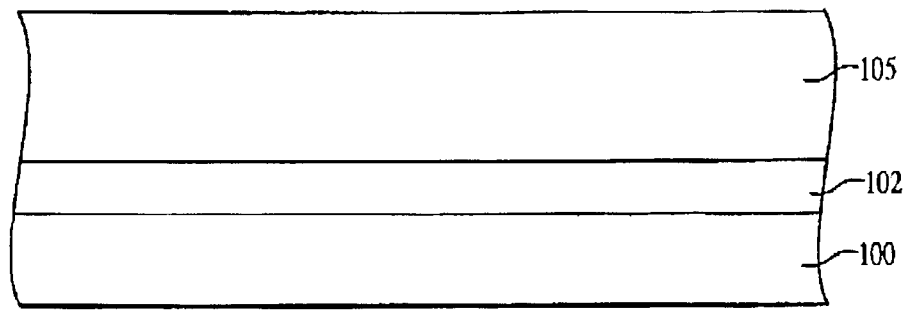
FIG. 3 illustrates the semiconductor substrate of FIG. 2 at a stage of processing subsequent to that shown in FIG. 2.

Reference is now made to FIG. 3. A relaxed silicon germanium (SiGe) layer 105 with a graded germanium content is next formed over the first source/drain layer 102 to a thickness of about 2,000 Angstroms to about 40,000 Angstroms. According to an embodiment of the present invention, the relaxed silicon germanium (SiGe) layer 105 is epitaxially grown by an ultra high vacuum chemical vapor deposition (UHVCVD) method and using a linear graded buffer layer technique, as described by K. Rim et al. in *Strained Si NMOSFETs for High Performance CMOS Technology*, Symp. on VLSI Tech. Digest of Technical Papers, p. 59 (2001) and by K. Rim, et al. in *Fabrication and Analysis of Deep Submicron Strained-Si N-MOSFET's*, IEEE Trans. Electron. Devices, 47, p. 1406 (2000), the disclosures of which are incorporated by reference herein.

As analyzed by Rim et al., the germanium (Ge) content in the silicon germanium (SiGe) layer 105 is graded in steps using a linear graded buffer layer technique, by increasing the germanium content from 0 to about 20% over a thickness of about 1.5 $\mu$m. The fully relaxed silicon germanium (SiGe) layer 105 with the graded germanium content is capped with a 7,000 Angstroms thick relaxed silicon germanium (SiGe) layer with a constant germanium content of about 20%. Dichlorosilane and germane are used as the silicon and germanium source precursors at growth temperatures of about 700° C. to about 750° C. As described in Rim et al., both the thickness of the relaxed silicon germanium (SiGe) layer 105 and the germanium (Ge) content in the silicon germanium (SiGe) layer are verified by cross-sectional TEM, Rutherford back-scattering and Raman spectroscopy. X-ray diffraction analysis quantified the germanium (Ge) content to about 15% and 20%. As explained in more detail below, the relaxed silicon germanium (SiGe) layer 105 with graded germanium (Ge) content acts as a buffer layer for strained silicon (Si) layer 120 (FIG. 7), which will form a strained silicon channel for a vertical NMOS transistor fabricated according to the present invention.

Figure 4:
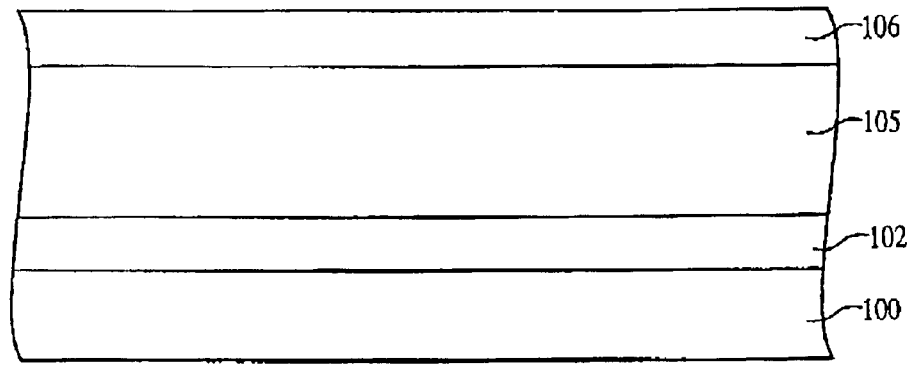
FIG. 4 illustrates the semiconductor substrate of FIG. 2 at a stage of processing subsequent to that shown in FIG. 3.

Referring now to FIG. 4, a second source/drain layer 106 is formed over the relaxed silicon germanium (SiGe) layer 105 with graded germanium content. The second source/drain layer 106 may be formed by ion implantation, epitaxial growth, or a combination of these techniques.

Figure 5:
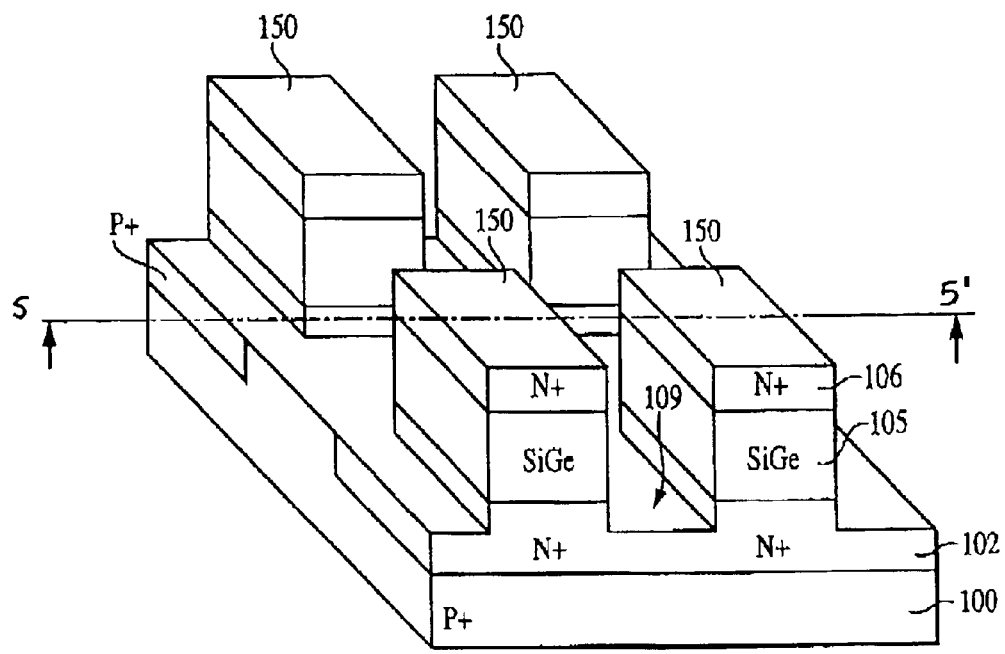
FIG. 5 illustrates a partial three-dimensional of the semiconductor substrate of FIG. 2 at a stage of processing subsequent to that shown in FIG. 4.
Figure 6:
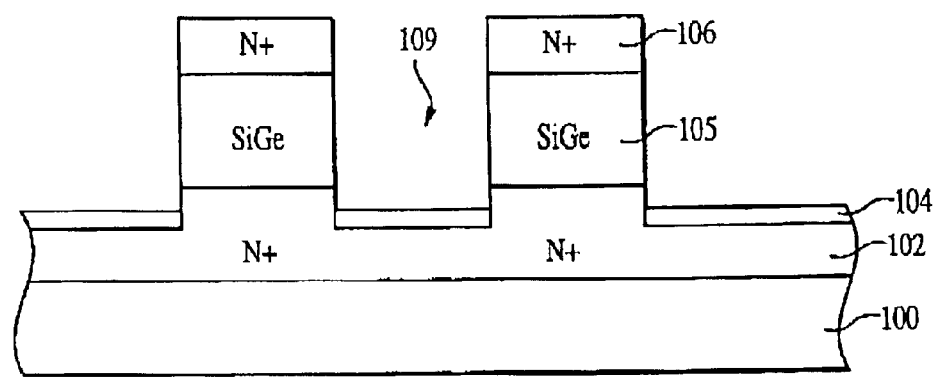
FIG. 6 illustrates a cross-sectional view of the the semiconductor substrate of FIG. 4 taken along line 5–5'.
Figure 10:
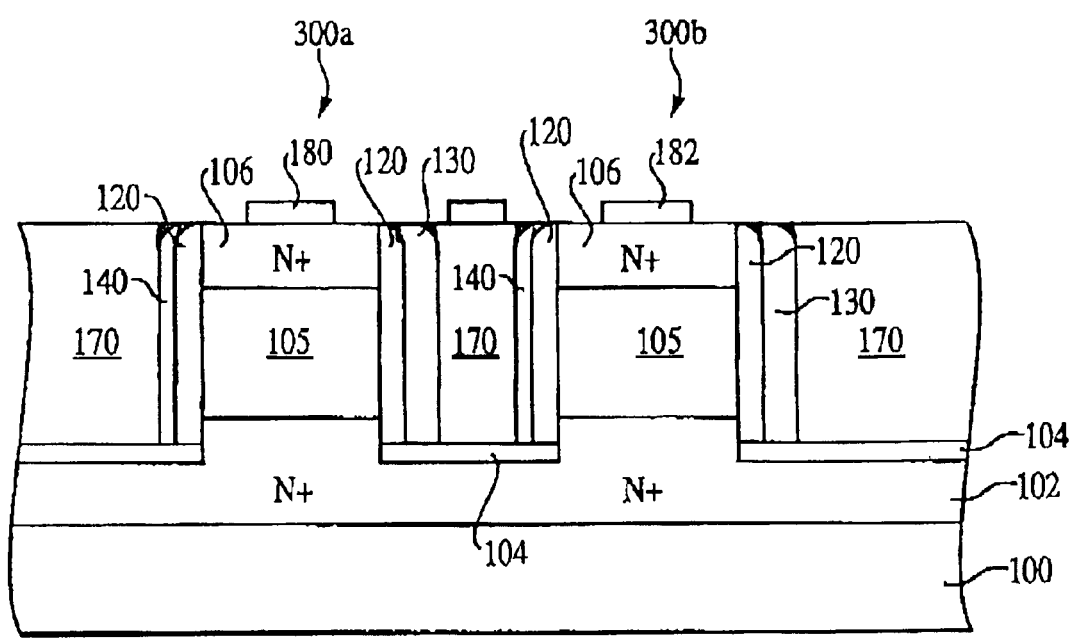
FIG. 10 illustrates the semiconductor substrate of FIG. 6 at a stage of processing subsequent to that shown in FIG. 9.

A photoresist is subsequently applied and selectively exposed to provide a mask for the directional etching of trenches 109 (FIGS. 5, 6) by reactive ion etching (RIE), for example. As shown in FIG. 5, the directional etching results in the formation of a plurality of pillars or column bars 150 (FIG. 5) each comprising a stack of the first source/drain layer 102, the relaxed silicon germanium (SiGe) layer 105 with graded germanium content and the second source/drain layer 106. The resulting pillars or column bars 150 provide first and second source/drain regions 102 and 106, respectively, and silicon germanium (SiGe) body region 105 for NMOS transistors 300a, 300b (FIG. 10). Oxide layer 104 (FIG. 6) is formed on the surface of the p+ silicon substrate 100 and the first source/drain layer 102 to surround the NMOS transistors 300a, 300b (FIG. 10) with relaxed silicon germanium (SiGe) body regions 105 having graded germanium content. As noted above, the previously-mentioned processing steps for the fabrication of ultra-thin vertical pillars or column bars 150 are similar in part to the ones described in U.S. Pat. No. 6,072,209 to Noble et al. and U.S. Pat. No. 6,150,687 to Noble et al. (both of which are incorporated by reference herein) to the extent that the processing steps for vertical gate formation are similar, but the materials for the formation of the respective vertical transistors are different.

Figure 7:
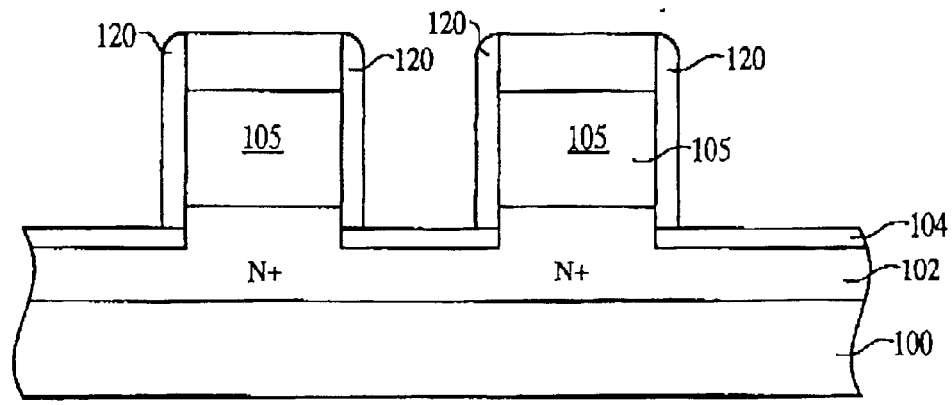
FIG. 7 illustrates the semiconductor substrate of FIG. 6 at a stage of processing subsequent to that shown in FIG. 6.
Figure 8:
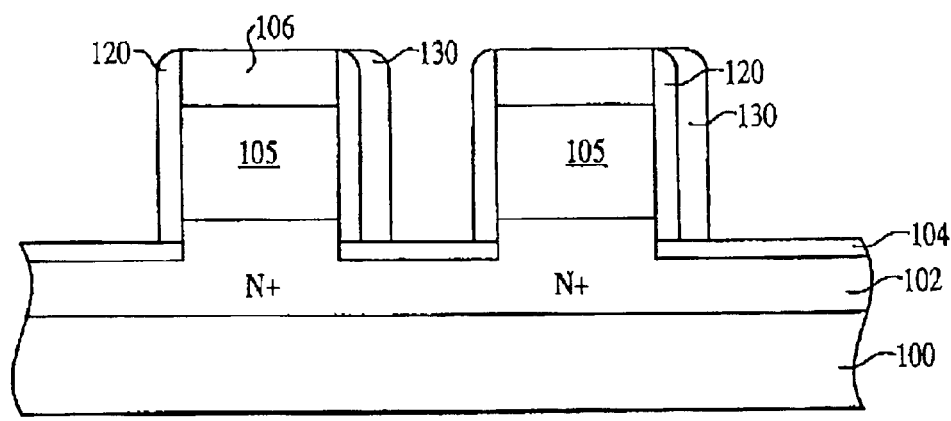
FIG. 8 illustrates the semiconductor substrate of FIG. 6 at a stage of processing subsequent to that shown in FIG. 7.

Referring now to FIGS. 7–8, a strained silicon layer of about 200 Angstroms to about 2,000 Angstroms is formed on each side of the relaxed silicon germanium (SiGe) body region 105 with graded germanium content and directionally etched to leave strained silicon channel layer 120 (FIG. 7) on two opposing sidewalls of the pillars. As described by K. Rim et al. in *Strained Si NMOSFETs for High Performance CMOS Technology*, Symp. on VLSI Tech. Digest of Technical Papers, p. 59 (2001), the strained silicon channel layer 120 may be epitaxially grown by an ultra high vacuum chemical vapor deposition (UHVCVD) method at about 1000° C. As reported by Rim et al., the strain state of the strained silicon channel layer 120 can be verified and confirmed by cross-sectional TEM, Rutherford back-scattering and Raman spectroscopy.

As analyzed by Rim et al., when strained silicon is formed on a relaxed germanium layer, a large lattice mismatch occurs between the relaxed germanium layer and the strained silicon layer. As also shown by M. Fischetti et al. in *Band structure, deformation potentials, and carrier mobility in strained Si, Ge, and SiGe alloys*, J. of Appl. Phys., 80, p. 2234 (1996) (the disclosure of which is incorporated by reference herein), a pseudo-morphic layer of silicon formed on relaxed silicon germanium is under biaxial tensile strain which, in turn, modifies the band structure and enhances the carrier transport. In an electron inversion layer, the subband splitting is larger in strained silicon (Si) than in unstrained silicon because of the strain-induced band splitting in addition to that provided by quantum confinement. The ground level splitting ($E_0(d_4)-E_0(d_2)$) in an MOS inversion layer at 1 MV/cm transverse field is about 120 and about 250 meV for unstrained and strained silicon, respectively.

As demonstrated by J. Wesller et al. in *Strain Dependence of the Performance Enhancement in Strained-Si n-MOSFETs*, IEDM Tech. Dig., p 373 (1994) and further by Mizuno et al. in *Advanced SOI-MOSFETs with Strained-Si Channel for High Speed CMOS-Electron/Hole Mobility Enhancement*, Symp. on VLSI Tech., p. 210 (2000) (the disclosures of which are incorporated by reference herein), the increase in energy splitting reduces intervalley scattering and enhances NMOSFET mobility for vertical fields lower than about 0.6 MV/cm. Similarly, in *Transconductance Enhancement in Deep Submicron Strained-Si n-MOSFETs*, IEDM Tech. Dig., p. 707 (1998) (the disclosure of which is incorporated by reference herein), K. Rim et al. have demonstrated that the increase in energy splitting reduces intervalley scattering and enhances NMOSFET mobility for vertical fields higher than about 1 MV/cm. According to the studies conducted by Rim et al., biaxial tensile strain in thin silicon layers grown pseudomorphically on relaxed silicon germanium layers splits the 6-fold degeneracy in a silicon conduction band. The splitting causes the 2-fold degenerate ($\Delta_2$) valleys to be preferentially populated, suppressing intervalley scattering.

Finally, as shown by K. Rim, et al. in *Fabrication and Analysis of Deep Submicron Strained-Si N-MOSFET's*, IEEE Trans. Electron. Devices, 47, p. 1406 (2000) (the disclosures of which is incorporated by reference herein), the scaled transconductance $g_m$ is also improved due to the reduced density of states and enhanced non-equilibrium transport. As shown by Rim et al. in the above-mentioned study, although the strained and un-strained-Si MOSFETs exhibit similar short-channel effects, the intrinsic transconductance of the strained Si devices is enhanced by about 60% for the entire channel length range investigated. Rim et al. also concluded that reduced carrier-phonon scattering for electrons with average energies (less than a few hundred meV) accounts for the enhanced high-field electron transport in strained silicon layers.

Referring back to the drawings and as illustrated in FIG. 8, a thick oxide layer 130 of about 1,000 Angstroms to about 20,000 Angstroms is next formed over the strained silicon layer 120. Another masking step can be employed to isotropically etch the oxide layer 130 off of some of the sidewalls of pillars or column bars 150 and leave the oxide only on one sidewall of each column bar 150 as required for particular configurations. Again, the above-described steps are similar in part to the ones detailed in U.S. Pat. No. 6,150,687 to Noble et al. and incorporated by reference in this application.

Figure 9:
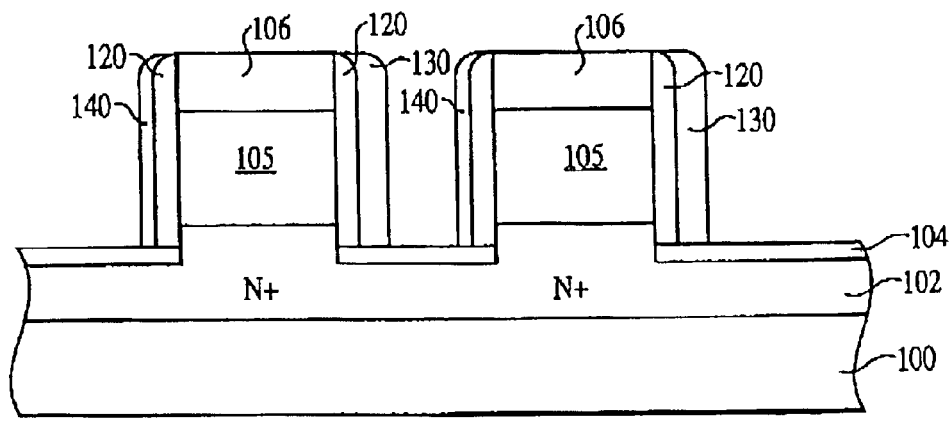
FIG. 9 illustrates the semiconductor substrate of FIG. 6 at a stage of processing subsequent to that shown in FIG. 8.

In FIG. 9, a gate oxide layer 140 is formed on the exposed sidewalls of the strained silicon layer 120. The gate oxide 140 may be formed, for example, by thermal growth, or by dry oxidation at high temperatures under an oxygen atmosphere, or by thermally growing an oxynitride using a nitrogen and oxygen source. The drain and source regions of the NMOS transistors 300a, 300b are in the strained silicon channel layer 120 along the sidewalls of each pillar 105. Although the embodiments illustrated above have been described with reference to the formation of vertical gate structures, the invention is not limited to this embodiment. Accordingly, the present invention contemplates the formation of ultra-thin body transistors with strained silicon channels which include other types of gate structures, such as for example, horizontal gate structures as described in U.S. Pat. No. 6,150,687 to Noble et al., or horizontal replacement gate structures, a variation of U.S. Pat. No. 6,150,687 to Noble et al described in U.S. patent application Ser. No. 09/596,266 filed Jun. 16, 2000.

FIG. 10 illustrates the formation of transistor gates 170 and wiring contacts 180, 182. As shown in FIG. 10, the transistor gates 170, which may be formed of polysilicon for example, are vertically oriented gates and are associated with a side of the pillars 150. The transistor gates 170 of FIG. 10 may be formed, for example, by a deposition method such as chemical vapor deposition (CVD) at a temperature of about 550° C. to about 650° C. and a pressure of less than about 2 Torr. The top portions of the CVD deposited polysilicon material located above the second source/drain layer 105 (FIG. 10) are then removed by CMP, for example, to form the transistor gates 170. If desired, dopants such as phosphorous, boron or nitrogen may be implanted subsequently into the transistor gates 170 to increase their conductivity. FIG. 10 also illustrates the thick oxide layer 130 formed, as described above, on an opposing side of each of the pillar 150 for isolating the transistor gate 170 from neighboring pillars.

The ultra-thin vertical NMOS transistors 300a, 300b with relaxed silicon germanium (SiGe) body regions 105 and strained silicon channels 120 may be employed in the fabrication of vertical gate array structures comprising a plurality of such ultra-thin vertical NMOS transistors with strained silicon channels, with or without PMOS transistors. The ultra-thin vertical NMOS transistors 300a, 300b with strained silicon channel 120 may be also employed in the fabrication of gate array structures comprising other conventional planar structures, as described in the literature and formed by known conventional techniques, in addition to the vertical gate structures of the present invention.

Figure 11:
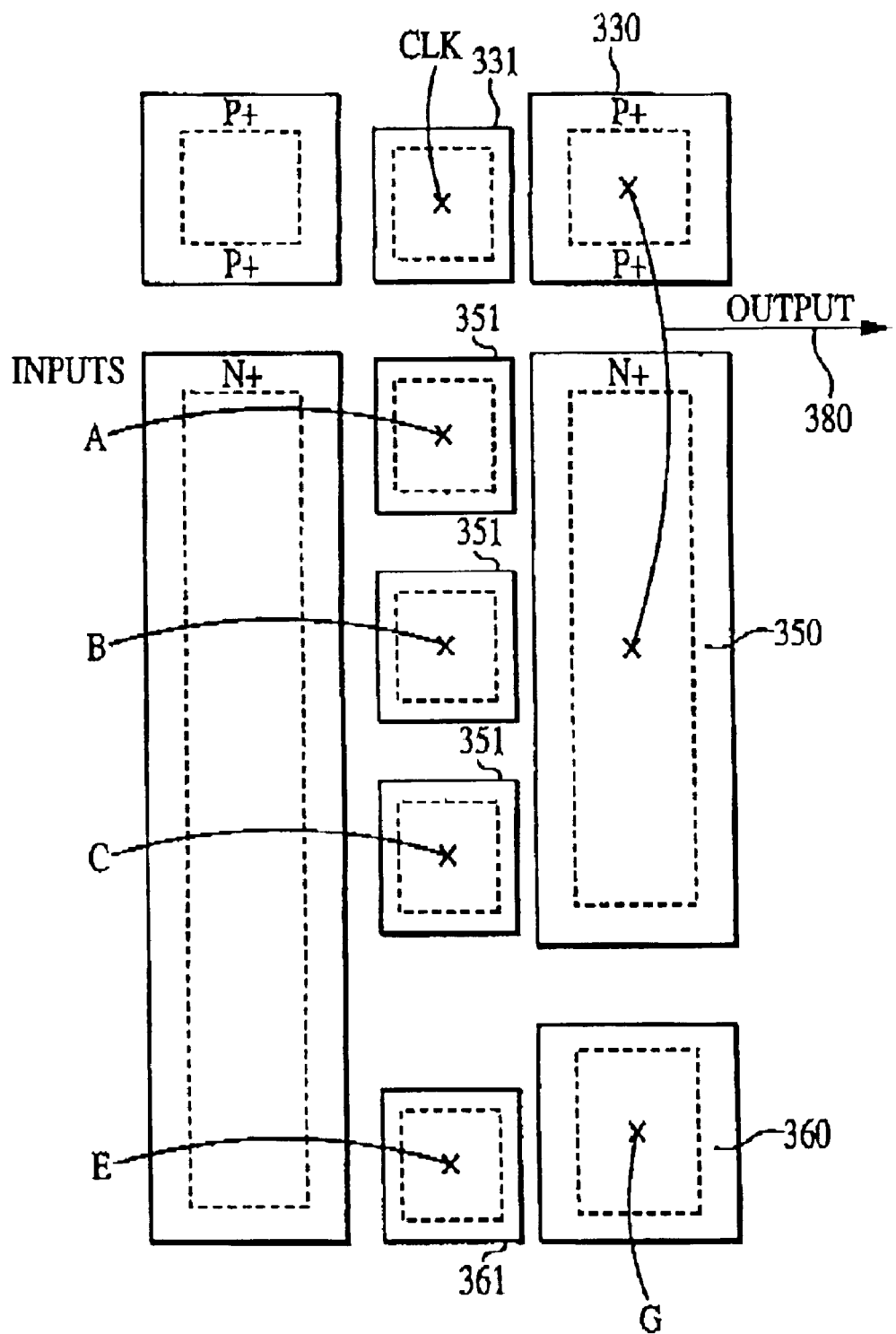
FIG. 11 is a top view illustrating wiring contacts consistent with ultra-thin vertical transistors with strained silicon channels as used in a 3-input NOR gate of a dynamic logic circuit fabricated according to the present invention.

FIG. 11 illustrates a logic gate implementation using ultra-thin vertical NMOS transistors having relaxed silicon germanium (SiGe) body regions with graded germanium content and strained silicon channels fabricated according to embodiments of the present invention. The logic gate implementation of FIG. 11 is a dynamic 3-input NOR gate shown as circuit 500 of FIG. 13. As illustrated in FIG. 11, a number of logic inputs A, B, C are coupled to gates 351 for a number of ultra-thin vertical NMOS transistors with relaxed silicon germanium (SiGe) body regions and strained silicon channels formed according to the present invention and illustrated as block 350. FIG. 11 further illustrates a clock input coupled to gate 331 of a PMOS transistor 330. As one of ordinary skill in the art would realize, the circuit shown in FIG. 11 comprises the PMOS transistor 330 coupled between a power supply (e.g. Vdd) and an output which precharges the output high during a precharge stage and prior to the arrival of a number of input signals as the number of logic inputs A, B and C. An output 380 is illustrated as coupled to both the PMOS transistor 330 and the number of ultra-thin vertical NMOS transistors with relaxed silicon germanium (SiGe) body regions with graded germanium content and strained silicon channels shown as the block 350. The output 380 will be coupled to one of the number of inputs of a subsequent static logic circuit portion (not shown) as part of a CMOS logic circuit.

Figure 12:
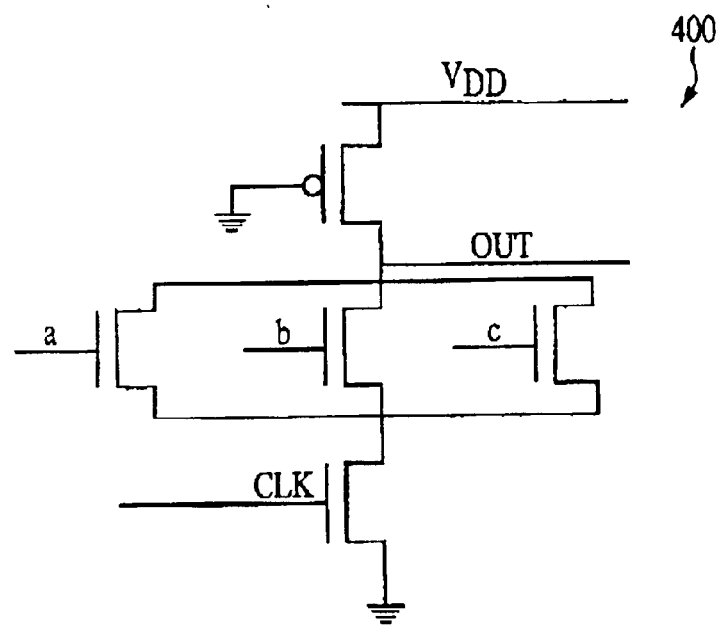
FIG. 12 illustrates a schematic diagram for a pseudo NMOS OPL logic circuit fabricated according to the present invention.

FIG. 12 illustrates the implementation of the ultra-thin vertical NMOS transistors 300a, 300b with silicon germanium (SiGe) body regions and strained silicon channels in the fabrication of a pseudo-NMOS output prediction logic (OPL) circuit 400. In the pseudo-NMOS OPL circuit 400 of FIG. 12, all of the outputs are charged high by a PMOS device with a gate at ground potential. As analyzed by Kio, S.; McMurchie L.; Sechen, C. in *Application of Output Prediction Logic to Differential CMOS*, Proc. IEEE Computer Society Workshop on VLSI, pp. 57–65, May 2001 and by McMurchie L.; Kio, S.; Yee, G.; Thorp, T.; Sechen, C., *Output prediction logic: a High-Performance CMOS Design Technique*, Proc. International Conference on Computer Design, 2000, pp. 247–254, 2000 (the disclosures of which are incorporated herein), the "enable" or "evaluate" NMOS gates of a pseudo-NMOS OPL circuit are then clocked in succession and the logical output of each gate determined. If the logic gate pulls the output low, a DC path to ground forms and the gate works on a static or DC basis. If the logical output is a high level, then the PMOS device just keeps the output high.

The pseudo-NMOS OPL circuit 400 of FIG. 12 has an enable NMOS transistor at the bottom of the gate. When the clock (clk) is low, the gate is disabled, with the output being charged to a logic "1." When the clock goes high, the gate is enabled and becomes a pseudo-NMOS gate. The pull-up PMOS serves both to precharge the gate and to correct a high output when it glitches.

Figure 13:
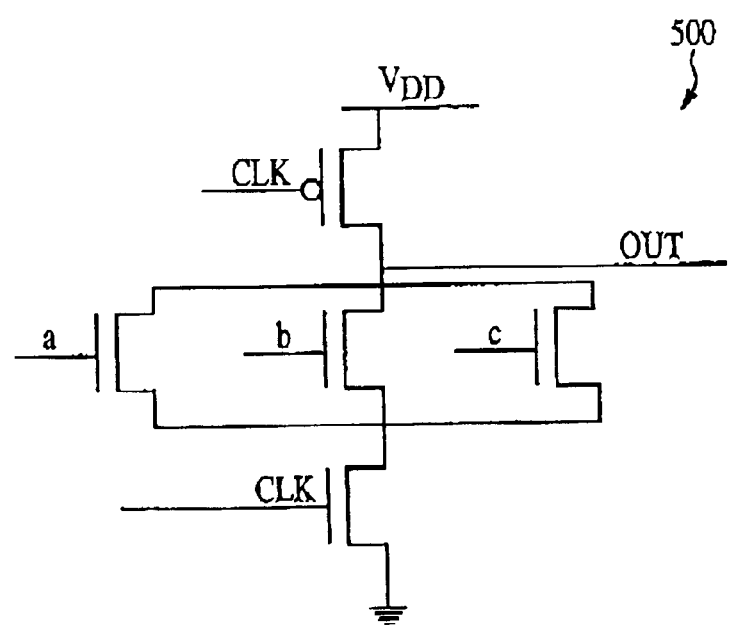
FIG. 13 illustrates a schematic diagram for a dynamic OPL logic circuit fabricated according to the present invention.

FIG. 13 illustrates a dynamic output prediction logic (OPL) circuit 500 in which the PMOS transistor is clocked to precharge the output high. As also analyzed by Kio, S.; McMurchie L.; Sechen, C. in *Application of Output Prediction Logic to Differential CMOS*, Proc. IEEE Computer Society Workshop on VLSI, pp. 57–65, May 2001 and by McMurchie L.; Kio, S.; Yee, G.; Thorp, T.; Sechen, C., *Output prediction logic: a High-Performance CMOS Design Technique*, Proc. International Conference on Computer Design, 2000, pp. 247–254, 2000 (the disclosures of which are incorporated herein), since the enable or evaluation function is performed at every gate in succession, the node will either be left high, or will be discharged to ground potential. These gates work only on a dynamic basis, by charge storage on capacitive nodes. As known in the art and as illustrated in FIG. 13, the OPL-dynamic gate looks similar to a domino gate, but with the output inverter missing. The gate precharges high, and the keeper transistor, if sized sufficiently large, will enable the output node to recover from glitches. As demonstrated by Kio, S.; McMurchie L.; Sechen, C. in *Application of Output Prediction Logic to Differential CMOS*, Proc. IEEE Computer Society Workshop on VLSI, pp. 57–65, May 2001 (the disclosure of which is incorporated herein), if the clock arrives too early, a gate may glitch so much that the keeper transistor shuts off, causing the output voltage to remain at a value possibly well below Vdd or even zero.

Although the combination of the ultra-thin vertical NMOS transistors with silicon germanium body regions and strained silicon channels with the fastest OPL circuit families results in the fastest possible circuit operation, the ultra-thin vertical NMOS transistors 300*a*, 300*b* (FIG. 10) of the present invention may be also incorporated in other semiconductor device, including various processor system components, such as for example, a central processing unit (CPU), or in any of the various types of memory devices, such as for example, RAM, ROM, and others. They may also be used in any type of integrated circuit controller for a floppy disk, a hard disk, a ZIP, or a CD-ROM disk.

Figure 14:
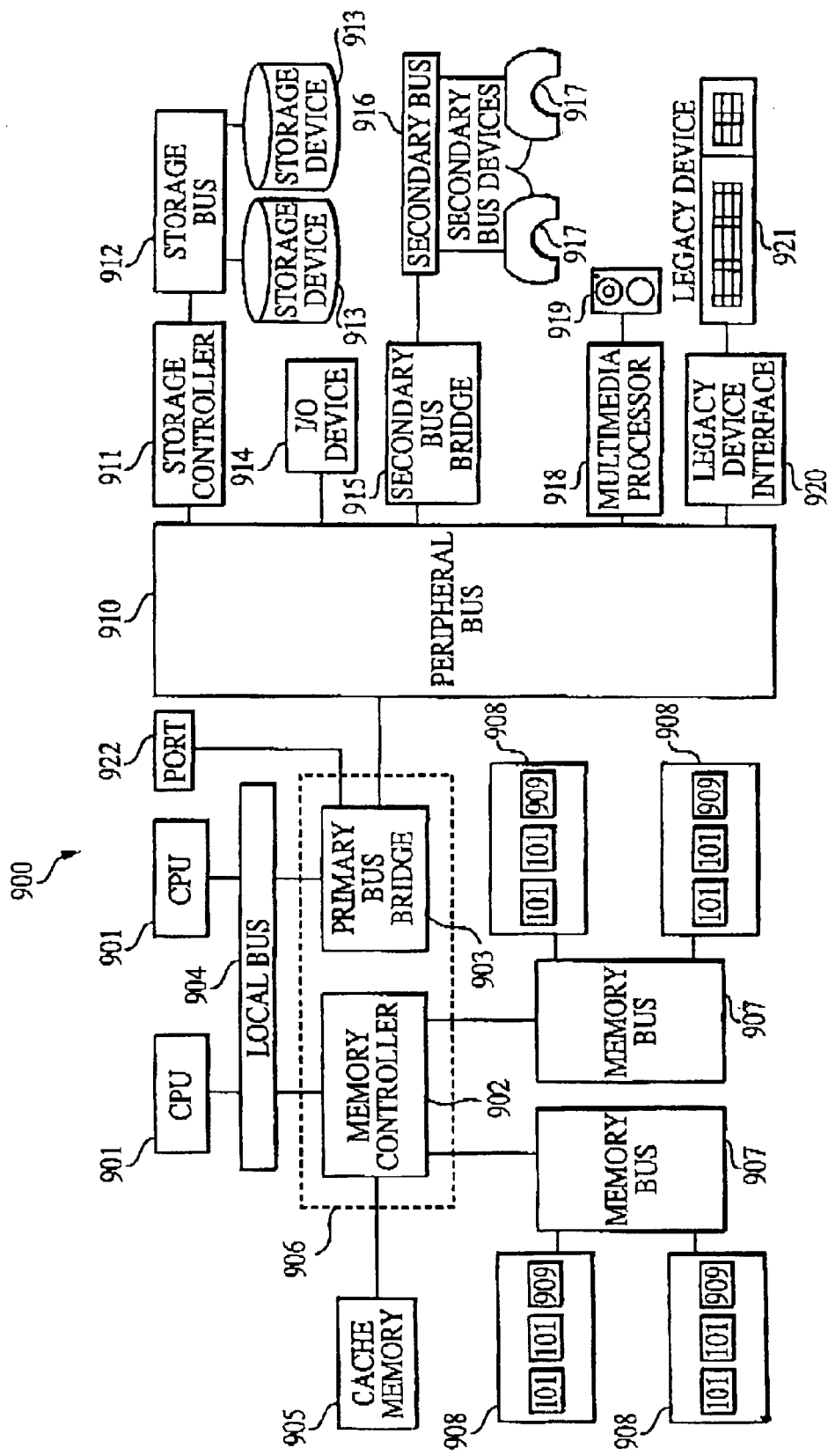
FIG. 14 illustrates a processing system having ultra-thin vertical transistors with strained silicon channels formed according to embodiments of the present invention.

FIG. 14 illustrates an exemplary processing system 900 which may utilize the ultra-thin vertical NMOS transistors 300*a*, 300*b* of the present invention. The processing system 900 includes one or more processors 901 coupled to a local bus 904. A memory controller 902 and a primary bus bridge 903 are also coupled the local bus 904. The processing system 900 may include multiple memory controllers 902 and/or multiple primary bus bridges 903. The memory controller 902 and the primary bus bridge 903 may be integrated as a single device 906.

The memory controller 902 is also coupled to one or more memory buses 907. Each memory bus accepts memory components 908 which include at least one memory device 100 comprising at least one ultra-thin vertical NMOS transistor, such as the ultra-thin vertical NMOS transistors 300*a*, 300*b* of the present invention. The memory components 908 may be a memory card or a memory module. Examples of memory modules include single inline memory modules (SIMMs) and dual inline memory modules (DIMMs). The memory components 908 may include one or more additional devices 909. For example, in a SIMM or DIMM, the additional device 909 might be a configuration memory, such as a serial presence detect (SPD) memory. The memory controller 902 may also be coupled to a cache memory 905. The cache memory 905 may be the only cache memory in the processing system. Alternatively, other devices, for example, processors 901 may also include cache memories, which may form a cache hierarchy with cache memory 905. If the processing system 900 include peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge 903 is coupled to at least one peripheral bus 910. Various devices, such as peripherals or additional bus bridges may be coupled to the peripheral bus 910. These devices may include a storage controller 911, an miscellaneous I/O device 914, a secondary bus bridge 915, a multimedia processor 918, and an legacy device interface 920. The primary bus bridge 903 may also coupled to one or more special purpose high speed ports 922. In a personal computer, for example, the special purpose port might be the Accelerated Graphics Port (AGP), used to couple a high performance video card to the processing system 900.

The storage controller 911 couples one or more storage devices 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be an local area network interface, such as an Ethernet card. The secondary bus bridge may be used to interface additional devices via another bus to the processing system. For example, the secondary bus bridge may be an universal serial port (USB) controller used to couple USB devices 917 via to the processing system 900. The multimedia processor 918 may be a sound card, a video capture card, or any other type of media interface, which may also be coupled to one additional devices such as speakers 919. The legacy device interface 920 is used to couple legacy devices, for example, older styled keyboards and mice, to the processing system 900.

The processing system 900 illustrated in FIG. 14 is only an exemplary processing system with which the invention may be used. While FIG. 14 illustrates a processing architecture especially suitable for a general purpose computer, such as a personal computer or a workstation, it should be recognized that well known modifications can be made to configure the processing system 900 to become more suitable for use in a variety of applications. For example, many electronic devices which require processing may be implemented using a simpler architecture which relies on a CPU 901 coupled to memory components 908 and/or memory devices 100 comprising at least one ultra-thin vertical NMOS transistors 300a, 300b. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

Accordingly, the above description and accompanying drawings are only illustrative of exemplary embodiments that can achieve the features and advantages of the present invention. It is not intended that the invention be limited to the embodiments shown and described in detail herein. The invention is limited only by the scope of the following claims.

What is claimed as new and desired to be protected by Letters Patent of the United States is:

1. A vertical MOS transistor comprising:
   a semiconductor substrate;
   a relaxed silicon germanium region formed over said substrate, said relaxed silicon germanium region having a graded germanium content;
   source and drain regions disposed on respective top and bottom sides of said relaxed silicon germanium region and in contact with said relaxed silicon germanium region; and
   a strained silicon layer in contact with said relaxed silicon germanium region.

2. The vertical MOS transistor of claim 1 further comprising a silicon oxide layer in contact with said strained silicon layer.

3. The vertical MOS transistor of claim 2 further comprising a vertical transistor gate in contact with said silicon oxide layer.

4. The vertical MOS transistor of claim 3, wherein said vertical transistor gate is a polysilicon gate.

5. The vertical MOS transistor of claim 1, wherein said relaxed silicon germanium layer has a thickness of about 2,000 Angstroms to about 40,000 Angstroms between said source and drain regions.

6. The vertical MOS transistor of claim 1, wherein said relaxed silicon germanium layer is an epitaxially grown layer.

7. The vertical MOS transistor of claim 1, wherein said relaxed silicon germanium layer has a graded germanium content of about 0% to about 20%.

8. The vertical MOS transistor of claim 1, wherein said strained silicon layer has a thickness of about 200 Angstroms to about 2,000 Angstroms.

9. The vertical MOS transistor of claim 1, wherein said source and drain layer is an n+ silicon layer and said vertical MOS transistor is an NMOS transistor.

10. The vertical MOS transistor of claim 1, wherein said strained silicon layer is under a biaxial tensile strain.

11. The vertical MOS transistor of claim 1, wherein said semiconductor substrate is a silicon substrate.

12. A vertical NMOS transistor comprising:
    a silicon substrate;
    a relaxed silicon germanium region formed over said silicon substrate, said relaxed silicon germanium region having a graded germanium content from about 0% to about 20%, said relaxed silicon germanium region having a top surface and a bottom surface;
    source and drain regions disposed on opposite sides of said relaxed silicon germanium region so that one of said source and drain regions is provided over and in contact with said top surface of said relaxed silicon germanium region, and the other of said source and drain regions is provided below and in contact with said bottom surface of said relaxed silicon germanium region; and
    a strained silicon layer in contact with said relaxed silicon germanium region with graded germanium content.

13. The vertical NMOS transistor of claim 12 further comprising a silicon oxide layer in contact with said strained silicon layer.

14. The vertical NMOS transistor of claim 13 further comprising a vertical polysilicon gate in contact with said silicon oxide layer.

15. The vertical NMOS transistor of claim 12, wherein said relaxed silicon germanium layer is an epitaxially grown layer by ultra high vacuum chemical vapor deposition.

16. The vertical NMOS transistor of claim 12, wherein said strained silicon layer is under a biaxial tensile strain.

17. A pseudo-NMOS output prediction logic circuit comprising:
    a plurality of logic inputs, a clock input and an output, wherein each of said plurality of logic inputs is coupled to a plurality of gates of vertical NMOS transistors comprising a relaxed silicon germanium region with a graded germanium content of about 15% to about 20% and a strained silicon channel in contact with said relaxed silicon germanium region, and wherein the dock output is coupled to a gate of a vertical PMOS transistor for precharging the output high.

18. A dynamic output prediction logic circuit comprising:
    a plurality of logic inputs, a clock input and an output, wherein each of said plurality of logic inputs is coupled to a plurality of gates of vertical NMOS transistors comprising a relaxed silicon germanium region with a graded germanium content of about 15% to about 20% and a strained silicon channel in contact with said relaxed silicon germanium region, and wherein the clock output is coupled to a gate of a vertical PMOS transistor for precharging the output high.

19. A processor-based system comprising:
    a processor; and
    an integrated circuit coupled to said processor, at least one of said integrated circuit and said processor comprising a vertical NMOS transistor including a relaxed silicon germanium body region with a graded germanium content of about 15% to about 20%; a strained silicon layer in contact with said relaxed silicon germanium body region; and source and drain regions formed adjacent said relaxed silicon germanium body region with said graded germanium content.

* * * * *

UNITED STATES PATENT AND TRADEMARK OFFICE
CERTIFICATE OF CORRECTION

PATENT NO. : 6,900,521 B2
DATED : May 31, 2005
INVENTOR(S) : Leonard Forbes et al.

It is certified that error appears in the above-identified patent and that said Letters Patent is hereby corrected as shown below:

Column 8,
Line 26, "pillar" should read -- pillars --;

Column 9,
Line 60, "device" should read -- devices --;

Column 10,
Line 4, "coupled the" should read -- coupled to the --;
Line 27, "include" should read -- includes --;
Lines 38-39, "an miscellaneous" should read -- a miscellaneous --;
Line 40, "an legacy" should read -- a legacy --;
Line 41, "also coupled" should read -- also be coupled --;
Line 51, "an local" should read -- a local --;
Line 55, "an universal" should read -- a universal --;
Line 56, "via to the" should read -- via the --;
Line 59, "to one additional" should read -- to additional --;

Column 11,
Line 7, "one ultra-thin" should read -- one of ultra-thin --;
Line 11, "system" should read -- systems --; and Column 12,
Line 40, "dock" should read -- clock --.

Signed and Sealed this

Sixth Day of June, 2006

JON W. DUDAS
*Director of the United States Patent and Trademark Office*